(12) United States Patent
Arita et al.

(10) Patent No.: US 12,295,089 B2
(45) Date of Patent: May 6, 2025

(54) ACTIVE GAS GENERATION APPARATUS

(71) Applicant: Toshiba Mitsubishi-Electric Industrial Systems Corporation, Tokyo (JP)

(72) Inventors: Ren Arita, Tokyo (JP); Kensuke Watanabe, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 895 days.

(21) Appl. No.: 17/442,136

(22) PCT Filed: Feb. 27, 2020

(86) PCT No.: PCT/JP2020/007951
§ 371 (c)(1),
(2) Date: Sep. 23, 2021

(87) PCT Pub. No.: WO2021/171462
PCT Pub. Date: Sep. 2, 2021

(65) Prior Publication Data
US 2022/0174807 A1 Jun. 2, 2022

(51) Int. Cl.
*H05H 1/00* (2006.01)
*H05H 1/24* (2006.01)

(52) U.S. Cl.
CPC ................ *H05H 1/2425* (2021.05)

(58) Field of Classification Search
CPC .......... H01J 37/32348; H01J 37/32559; H01J 37/32568; H05H 1/2425; H05H 1/2441; H05H 1/2431
See application file for complete search history.

(56) References Cited

FOREIGN PATENT DOCUMENTS

| | | |
|---|---|---|
| CN | 204014246 U | * 12/2014 |
| JP | 2004-103423 A | 4/2004 |
| JP | 2006-319192 A | 11/2006 |
| JP | 2007-144244 A | 6/2007 |
| JP | 2012-33385 A | 2/2012 |

OTHER PUBLICATIONS

International Search Report and Written Opinion mailed on May 19, 2020, received for PCT Application PCT/JP2020/007951, Filed on Feb. 27, 2020, 9 pages including English Translation.

(Continued)

*Primary Examiner* — Yuechuan Yu
(74) *Attorney, Agent, or Firm* — XSENSUS LLP

(57) ABSTRACT

In the present disclosure, in a high-voltage side electrode component, the electrode main dielectric film is provided on the lower surface of the electrode conductive film, and the electrode additional dielectric film is disposed below the electrode main dielectric film at an upper main/additional inter-dielectric distance. The electrode main dielectric film includes the whole electrode conductive film in a plan view, and has a formation area larger than the electrode conductive film. The electrode additional dielectric film includes the electrode conductive film in a plan view and has a formation area slightly larger than the electrode conductive film and smaller than the electrode main dielectric film. The ground side electrode component has the same features as the above-mentioned features of the high-voltage side electrode component.

18 Claims, 7 Drawing Sheets

(56) References Cited

OTHER PUBLICATIONS

Office Action issued Oct. 26, 2023 in Chinese Patent Application No. 202080018521.3 and English translation thereof.
Office Action issued on Jul. 15, 2023, in corresponding Korean patent Application No. 10-2021-7028450, 6 pages.
Japanese Office Action issued Nov. 16, 2021, in corresponding Japanese Patent Application No. 2020-546189.
International Preliminary Report on Patentability (Chapter I) and Written Opinion mailed on Sep. 9, 2022, In corresponding PCT/JP2020/007951, 13 pages.

* cited by examiner

F I G. 4
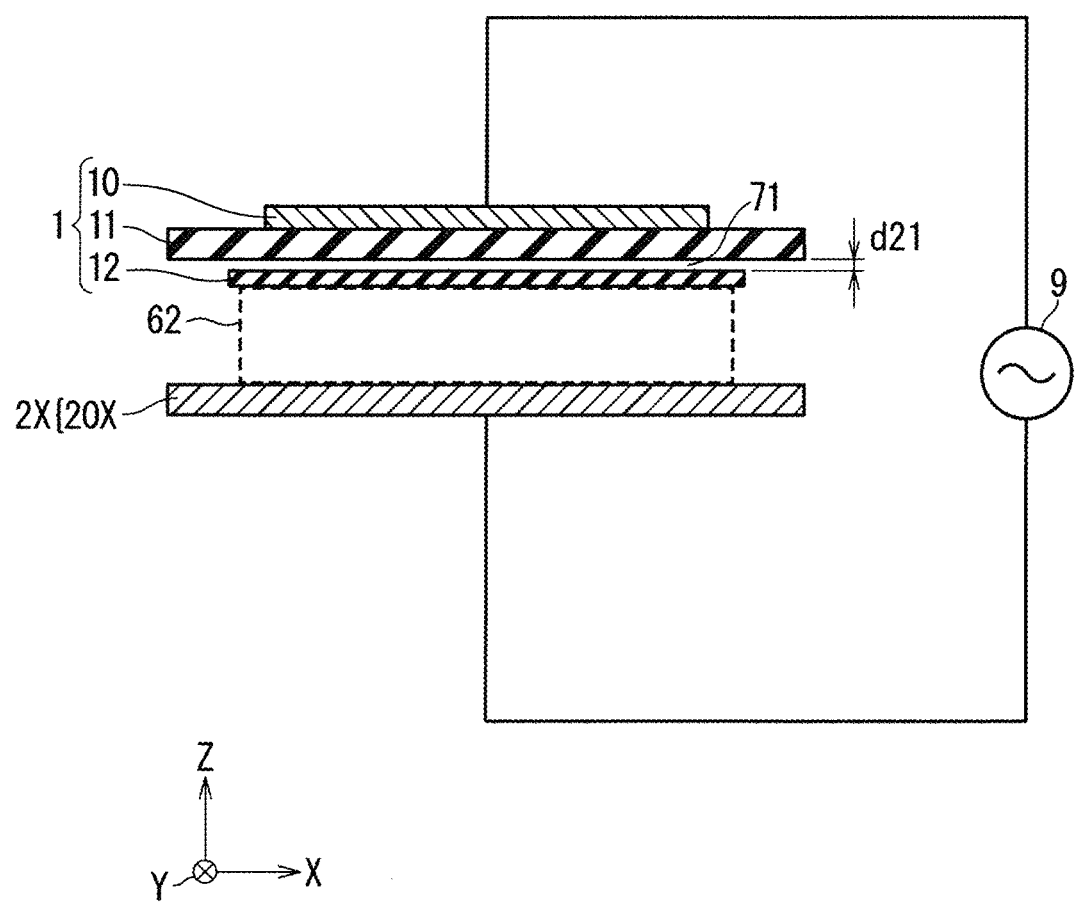

F I G. 5
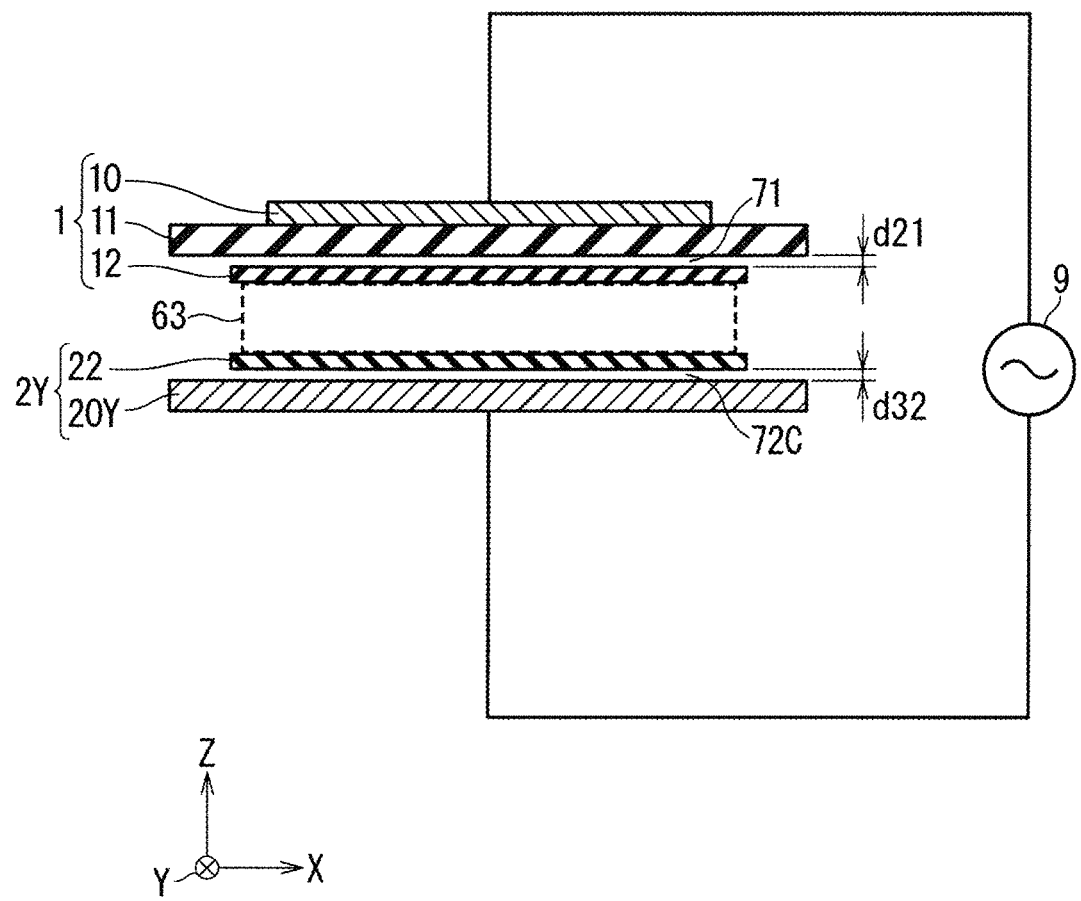

F I G. 7
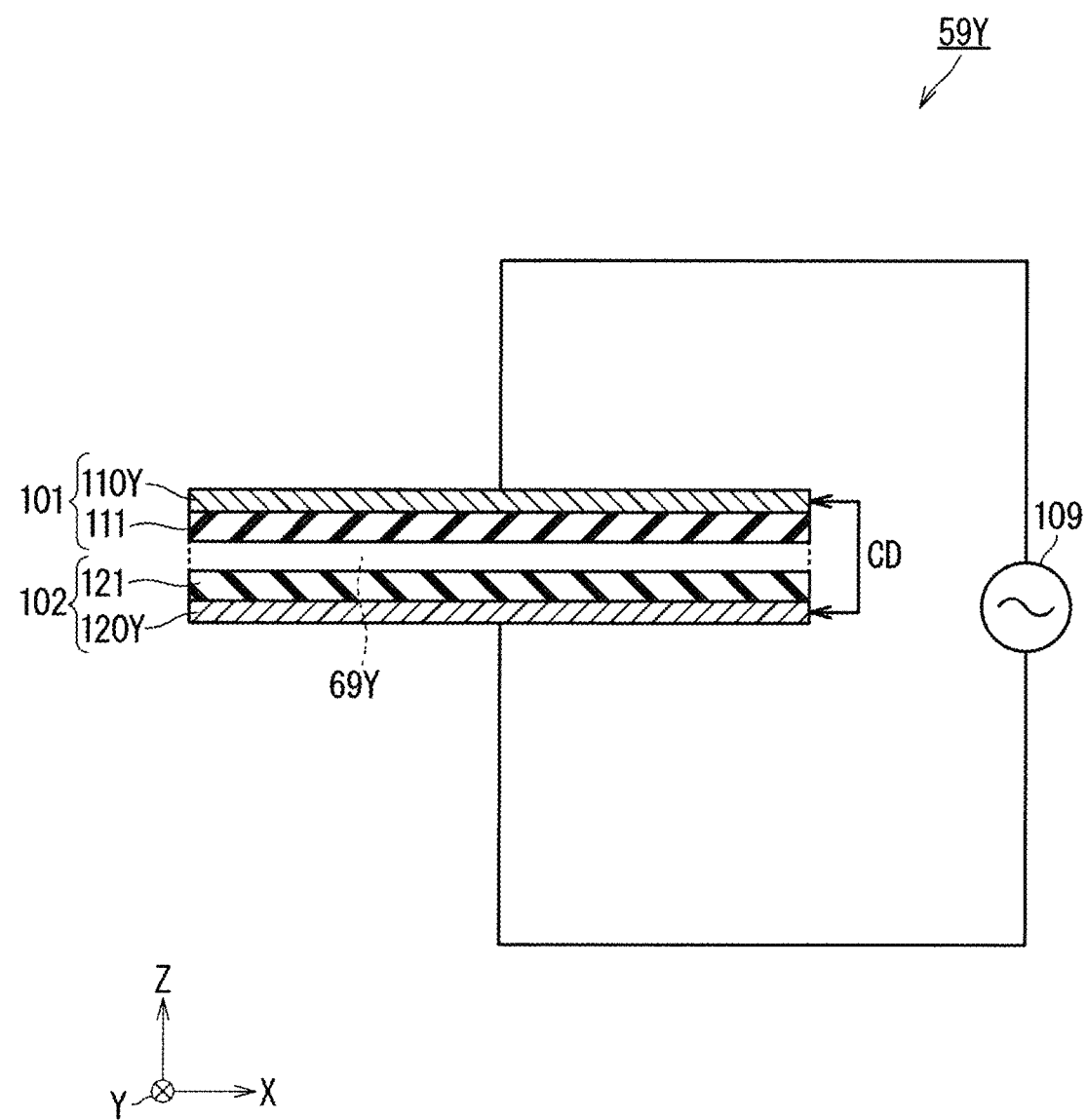

ACTIVE GAS GENERATION APPARATUS

CROSS-REFERENCE TO RELATED APPLICATION

The present application is based on PCT filing PCT/JP2020/007951, filed Feb. 27, 2020, the entire contents of which are incorporated herein by reference.

TECHNICAL FIELD

The present disclosure relates to an active gas generation apparatus including an electrode group of the parallel-plate type in which a first and a second electrode components face each other, and using a dielectric barrier discharge in the electrode group, and particularly to a structure of the electrode group.

BACKGROUND ART

As an active gas generation apparatus that activates a source gas supplied to a discharge space to generate an active gas, there are the active gas generation apparatuses having an electrode group of parallel-plate type in which the first and the second electrode components face each other.

The active gas generation apparatus causes a dielectric barrier discharge in the discharge space of the electrode group and activates the source gas supplied to the discharge space to generate the active gas. As such an active gas generation apparatus, for example, there is a discharge plasma processing apparatus disclosed in Patent Document 1.

FIG. 6 is an explanatory diagram illustrating a configuration of an active gas generation electrode group 59X of parallel-plate type used in a conventional active gas generation apparatus and the peripheral portion thereof. The XYZ rectangular coordinate system is illustrated in FIG. 6.

As illustrated in FIG. 6, a high-voltage side electrode component 101 and a ground side electrode component 102 face each other. In the configuration illustrated in FIG. 6, the ground side electrode component 102 is located below the high-voltage side electrode component 101.

The high-voltage side electrode component 101 includes an electrode conductive film 110X and an electrode dielectric film 111, and the ground side electrode component 102 includes an electrode conductive film 120X and an electrode dielectric film 121.

In the high-voltage side electrode component 101, an electrode dielectric film 111 is provided on the lower surface of the electrode conductive film 110X. In the ground voltage side electrode component 102, an electrode dielectric film 121 is provided on the upper surface of the electrode conductive film 120X.

The electrode dielectric film 111 includes the whole electrode conductive film 110X in a plan view in the XY plane, and has a formation area sufficiently larger than the electrode conductive film 110X.

The electrode dielectric film 121 includes the whole electrode conductive film 120X in a plan view in the XY plane, and has a formation area sufficiently larger than the electrode conductive film 120X.

In the active gas generation electrode group 59X, a discharge space 69X exists that includes a region where the electrode conductive film 110X and the electrode conductive film 120X overlap in a plan view in the XY plane in a main dielectric space where the electrode dielectric film 111 and the electrode dielectric film 121 face each other. Then, as illustrated in FIG. 6, the space other than the discharge space 69X in the main dielectric space is a non-discharge space 79.

For the active gas generation electrode group 59X having such a configuration, a dielectric barrier discharge is caused in the discharge space 69X by applying an AC voltage between the electrode conductive film 110 and the electrode conductive film 120 from a high-frequency power source 109.

PRIOR ART DOCUMENTS

Patent Documents

[Patent Document 1] Japanese Patent Application Laid-Open No. 2007-144244

SUMMARY

Problem to be Solved by the Invention

In the conventional active gas generation electrode group 59X, the surface of each of the electrode dielectric films 111 and 121 facing the discharge space 69X is heated by collisions of ions and electrons generated by the dielectric barrier discharge caused in the discharge space 69X.

Meanwhile, in the above main dielectric space, the surface of each of the electrode dielectric films 111 and 121 facing the non-discharge space 79 in which the dielectric barrier discharge is not caused, is not heated because no collisions of ions and electrons occur.

As a constituent material of the electrode dielectric films 111 and 121 forming the main dielectric space, a dielectric having a relatively low thermal conductivity is typically used. Here, the state of the surface of each of the electrode dielectric films 111 and 121 facing the main dielectric space when the dielectric barrier discharge occurs will be considered.

When the dielectric barrier discharge occurs, a large temperature difference occurs between the non-discharge space 79 side and the discharge space 69X side on the surfaces of the electrode dielectric films 111 and 121, respectively. Consequently, thermal stress is caused in each of the electrode dielectric films 111 and 121.

The thermal stress causes a problem of damage in that the electrode dielectric films 111 and 121 are broken near the boundary line between the non-discharge space 79 and the discharge space 69X.

Further, the electrode dielectric films 111 and 121 become conductive as the temperature becomes higher, and in the worst case, the dielectric barrier discharge stops occurring in the discharge space 69X, ending up deriving the phenomenon of causing of the arc discharge in the discharge space 69X. Hereinafter, the phenomenon is referred to as "phenomenon of disabling dielectric barrier discharge".

FIG. 7 is an explanatory diagram illustrating a configuration of a conventional active gas generation electrode group 59Y of parallel-plate type and the peripheral portion thereof. The XYZ rectangular coordinate system is illustrated in FIG. 7.

Hereinafter, the active gas generation electrode group 59Y will be described mainly on the points different from the active gas generation electrode group 59X.

The high-voltage side electrode component 101 includes an electrode conductive film 110Y and an electrode dielectric film 111, and the ground side electrode component 102 includes an electrode conductive film 120Y and an electrode dielectric film 121.

In the high-voltage side electrode component 101, an electrode dielectric film 111 is provided on the lower surface of the electrode conductive film 110Y. In the ground voltage side electrode component 102, an electrode dielectric film 121 is provided on the upper surface of the electrode conductive film 120Y.

The electrode conductive film 110Y is formed in a shape that matches the electrode dielectric film 111 in a plan view in the XY plane, and the electrode conductive film 120Y is formed in a shape that matches the electrode dielectric film 121 in a plan view in the XY plane.

In the active gas generation electrode group 59Y, a discharge space 69Y exists that includes a region where the electrode conductive film 110Y and the electrode conductive film 120Y overlap in a plan view in the XY plane in a main dielectric space where the electrode dielectric film 111 and the electrode dielectric film 121 face each other. And, the main dielectric space and the discharge space 69Y substantially match with each other; therefore, no non-discharge space substantially exists in the main dielectric space.

Consequently, unlike in the active gas generation electrode group 59X, no temperature difference occurs in the electrode dielectric films 111 and 121 in the active gas generation electrode group 59Y; therefore, no thermal stress occurs in the electrode dielectric films 111 and 121.

As a result, unlike the active gas generation electrode group 59X, no damage of the electrode dielectric films 111 and 121 occurs in the active gas generation electrode group 59Y.

However, in the active gas generation electrode group 59Y, each of the end surfaces of the electrode dielectric film 111 and the electrode conductive film 110Y matches with each other, and each of the end surfaces of the electrode dielectric film 121 and the electrode conductive film 120Y matches with each other.

Therefore, a separate problem arises in that the maintenance of the dielectric discharge barrier is aborted in the discharge space 69Y as a result of, if a creeping discharge CD is caused between the end portions of the high-voltage side electrode component 101 and the ground side electrode component 102 and the creeping discharge CD leads to arc discharge in some cases.

Meanwhile, in the discharge plasma processing apparatus disclosed in Patent Document 1, the electrode structure is adopted in which paths through which the processing gas flows are included in a laminated body in which the electrode conductive films (discharge electrodes) and electrode dielectric films (dielectrics) are alternately laminated and the electrode conductive films are formed to have uneven front and back surfaces as the above electrode conductive films. That is, the above discharge plasma processing apparatus adopts the electrode structure in which one plate dielectric is interposed between a pair of electrode conductive films (discharge electrodes), each of which has an uneven shape, facing each other.

In this manner, in the above discharge plasma processing apparatus, the electric field is prevented from concentrating at the portions being contact with the convex portions of the electrode conductive films in the electrode dielectric films by devising the shape of the electrode conductive films.

As a result, the above discharge plasma processing apparatus prevents the phenomenon of disabling dielectric barrier discharge from deriving by suppressing the generation of a high temperature field due to electric field concentration in the electrode dielectric films.

However, the electrode structure adopted in the above discharge plasma processing apparatus is mainly intended for the prevention of the above phenomenon of disabling dielectric barrier discharge, and is not intended for addressing the problem of the damage in the electrode dielectric films due to the generation of the thermal stress described in the active gas generation electrode group 59X in FIG. 6.

In addition, the prerequisite for the above discharge plasma processing apparatus is that the electrode conductive films and the electrode dielectric films are alternately laminated. For this reason, unlike the active gas generation electrode groups 59X and 59Y illustrated in FIGS. 6 and 7, the electrode structure in which the discharge spaces 69X or 69Y is formed in the main dielectric space in where the two electrode dielectric films 111 and 121 face each other cannot be adopted.

In addition, there has been a problem with the above discharge plasma processing apparatus in that an extra manufacturing cost is required since the structure of the electrode conductive films is provided with unevenness.

An object of the present disclosure is to solve the above problems and provide an active gas generation apparatus having an electrode structure that prevents the damaging phenomenon of the electrode dielectric films at a relatively moderate cost.

Means to Solve the Problem

An active gas generation apparatus according to the present disclosure is an active gas generation apparatus configured to generate an active gas obtained by activating a source gas supplied to a discharge space. The active gas generation apparatus includes a first electrode component, and a second electrode component provided to face the first electrode component, in which the first electrode component includes a first electrode conductive film, the second electrode component includes a second electrode conductive film, the discharge space including a region where the first and the second electrode conductive films overlap in a plan view in a main dielectric space where the first and the second electrode components face each other, in which an AC voltage is applied between the first and the second electrode conductive films exists, the first electrode component further includes a first electrode main dielectric film provided, on a side of the discharge space with respect to the first electrode conductive film, adjacent to the first electrode conductive film, and a first additional electrode dielectric film provided, on a side of the discharge space with respect to the first electrode main dielectric film, at a first distance with respect to the first electrode main dielectric film, a first additional dielectric space is provided between the first electrode main dielectric film and the first electrode additional dielectric film, the main dielectric space is provided between the first electrode additional dielectric film and the second electrode component, the first additional dielectric space is set such that a dielectric barrier discharge is not caused in the first additional dielectric space when the dielectric barrier discharge is caused in the discharge space in the main dielectric space, the first electrode main dielectric film includes the first electrode conductive film in a plan view, and has a formation area larger than the first electrode conductive film, and the first electrode additional dielectric film includes the first electrode conductive film in a plan view, and has a formation area larger than the first electrode conductive film and smaller than the first electrode main dielectric film.

Effects of the Invention

In the present disclosure, the main dielectric space is provided between the first electrode additional dielectric film and the second electrode component. The discharge space exists in the main dielectric space.

The first electrode additional dielectric film includes the first electrode conductive film in a plan view and has a formation area larger than the first electrode conductive film and smaller than the first electrode main dielectric film.

Therefore, when the dielectric barrier discharge is caused in the discharge space, the active gas generation apparatus of the present disclosure maintains the thermal stress at a low level because the first electrode additional dielectric film is heated in a relatively uniform manner due to the smaller formation area than the first electrode main dielectric film.

In addition, the first electrode main dielectric film is located at a position at the first distance from the first electrode additional dielectric film; therefore, relatively less heat to be transmitted from the first electrode additional dielectric film to the first electrode main dielectric film.

As a result, in the active gas generation apparatus of the present disclosure, the damaging phenomenon due to thermal stress during the dielectric barrier discharge can be suppressed, with respect to the first electrode additional dielectric film and the first electrode main dielectric film.

Further, the first electrode main dielectric film includes the first electrode conductive film in a plan view and has a larger forming area than the first electrode conductive film and the first electrode additional dielectric film; therefore, the occurrence of creeping discharge at between the end portion of the first electrode conductive film and the end portion of the second electrode conductive film can be effectively suppressed.

Therefore, the active gas generation apparatus of the present disclosure ensures to maintain the unobstructed occurrence state of the dielectric barrier discharge.

In addition, the electrode group adopted in the active gas generation apparatus of the present disclosure can be realized at a relatively moderate cost because all the first electrode conductive film, the first electrode main dielectric film, the first additional dielectric film, and the second electrode conductive film are not required to have an intricate structure.

The explicit purpose, feature, phase, and advantage of the present invention will be described in detail hereunder with attached drawings.

BRIEF DESCRIPTION OF DRAWINGS

FIG. 4 An explanatory diagram illustrating a structure of an active gas generation electrode group in an active gas generation apparatus according to Embodiment 2.

FIG. 5 An explanatory diagram illustrating a structure of an active gas generation electrode group in an active gas generation apparatus according to Embodiment 3.

FIG. 7 is an explanatory diagram illustrating a configuration of a conventional active gas generation electrode group of parallel-plate type (part 2).

DESCRIPTION OF EMBODIMENTS

Embodiment 1

Figure 1:
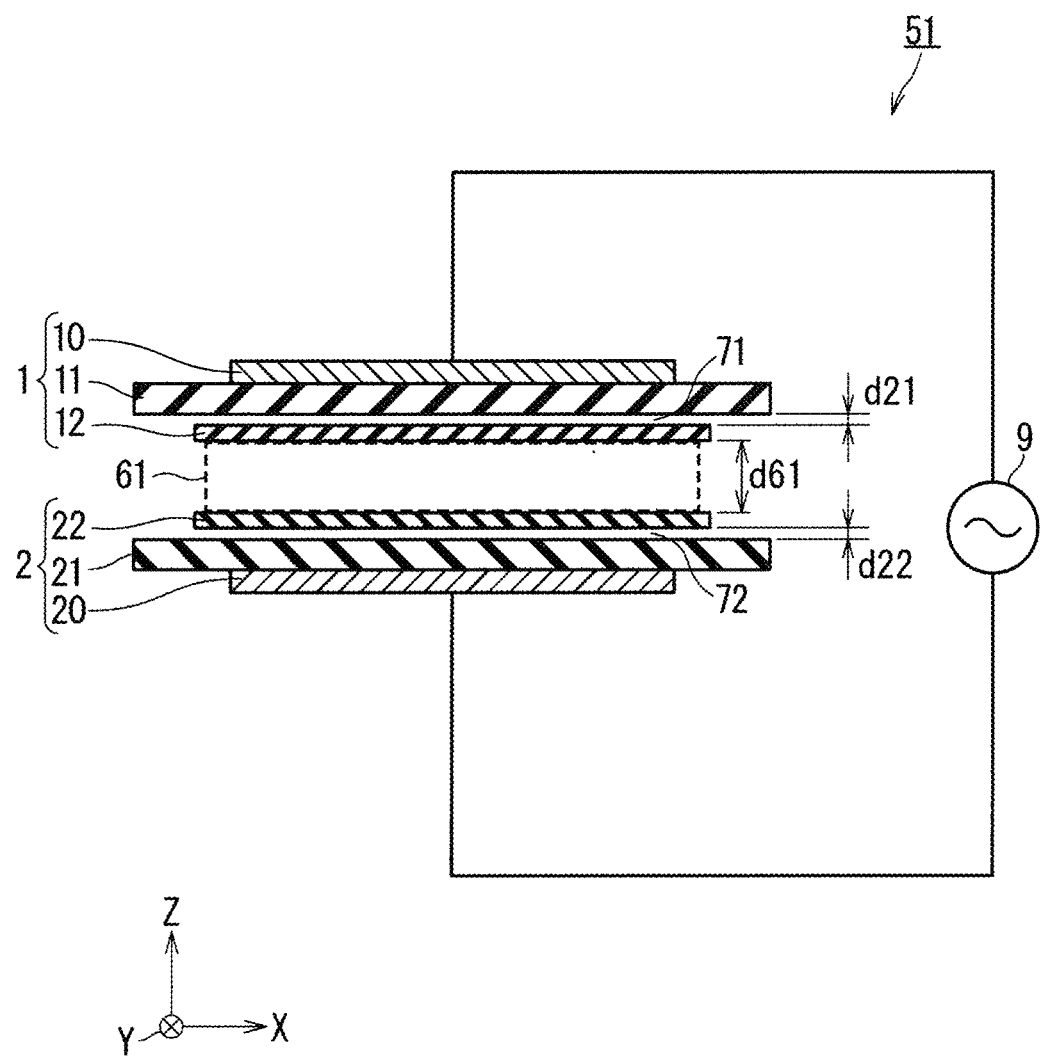
FIG. 1 An explanatory diagram illustrating a structure of an active gas generation electrode group in an active gas generation apparatus according to Embodiment 1.
Figure 2:
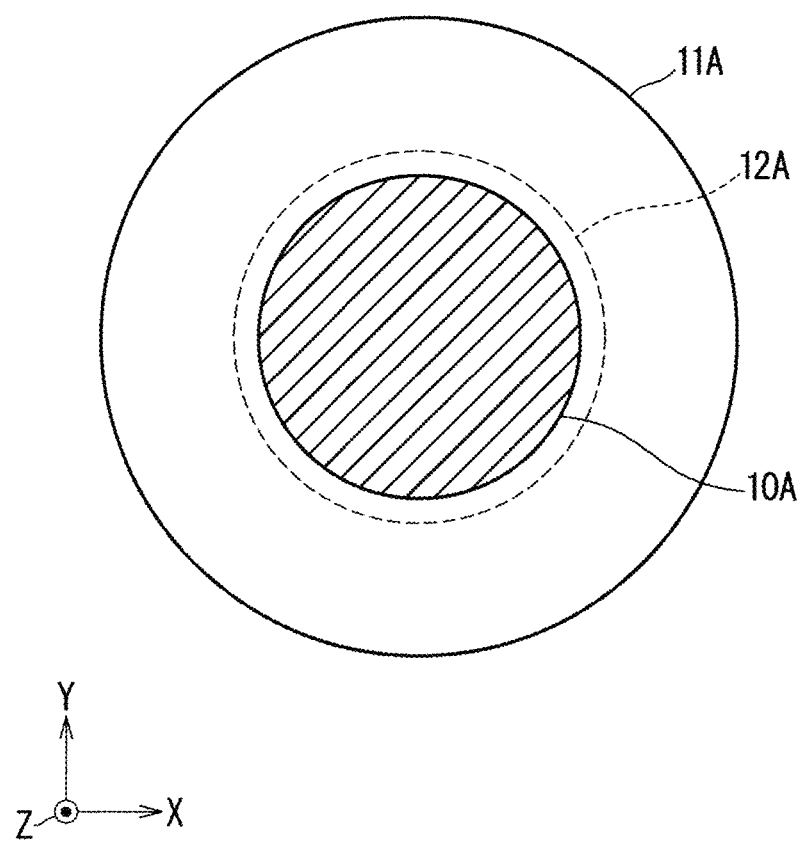
FIG. 2 A plan view illustrating a first mode of a high-voltage side electrode component illustrated in FIG. 1.
Figure 3:
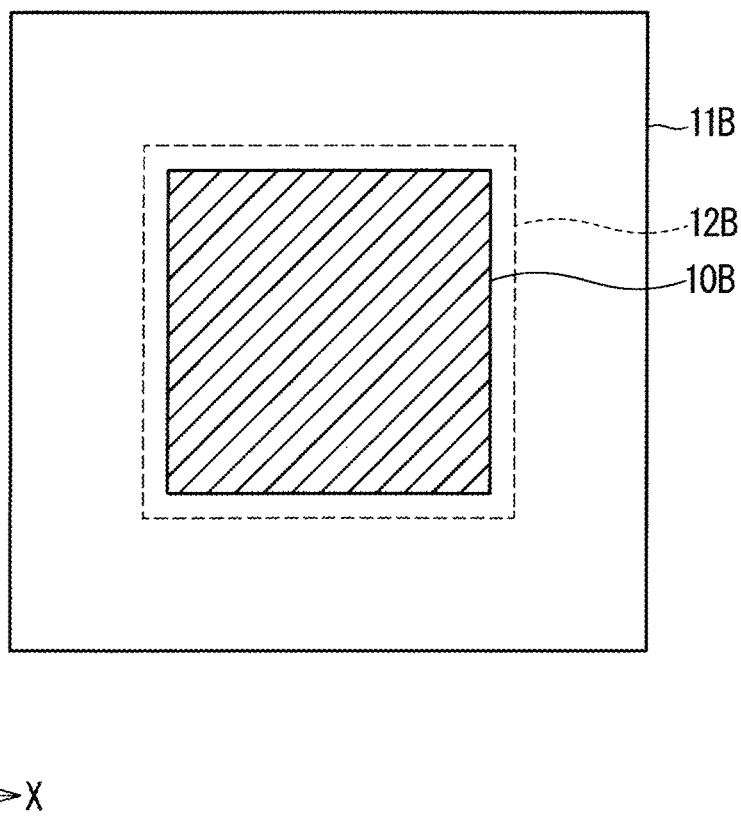
FIG. 3 A plan view illustrating a second mode of the high-voltage side electrode component illustrated in FIG. 1.
Figure 6:
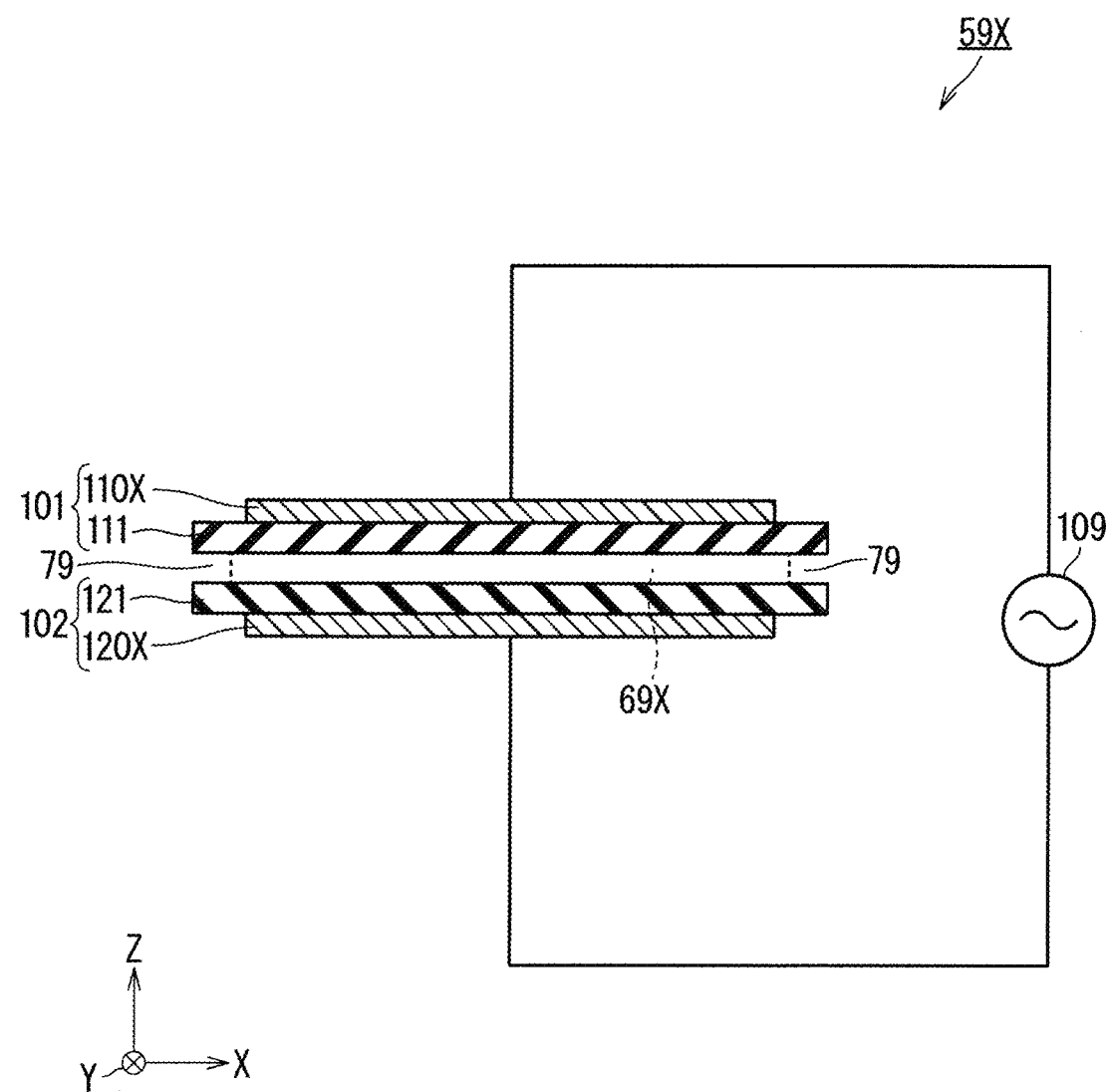
FIG. 6 is an explanatory diagram illustrating a configuration of a conventional active gas generation electrode group of parallel-plate type (part 1).

FIG. 1 is an explanatory diagram illustrating a structure of an active gas generation electrode group in an active gas generation apparatus according to Embodiment 1 of the present disclosure and the peripheral portion thereof. FIG. 2 is a plan view illustrating a first mode of a high-voltage side electrode component 1 illustrated in FIG. 1. FIG. 3 is a plan view illustrating a second mode of the high-voltage side electrode component 1 illustrated in FIG. 1. The XYZ rectangular coordinate system is illustrated in each of FIGS. 1 to 3.

As illustrated in FIG. 1, the high-voltage side electrode component 1 being a first electrode component and a ground side electrode component 2 being a second electrode component face each other. Specifically, the ground side electrode component 2 is located below the high-voltage side electrode component 1.

The high-voltage side electrode component 1 includes an electrode conductive film 10, an electrode main dielectric film 11 and an electrode additional dielectric film 12, and the ground side electrode component 2 includes an electrode conductive film 20, an electrode main dielectric film 21 and an electrode additional dielectric film 22.

In the high-voltage side electrode component 1, the electrode main dielectric film 11 is provided on the lower surface of the electrode conductive film 10, and the electrode additional dielectric film 12 is disposed below the electrode main dielectric film 11 at an upper main/additional inter-dielectric distance d21.

That is, the electrode main dielectric film 11 is provided, on the side of a discharge space 61 described later with respect to the electrode conductive film 10, adjacent to the electrode conductive film 10, and the electrode additional dielectric film 12 is provided, on the side of the discharge space 61 with respect to the electrode main dielectric film 11 at the upper main/additional inter-dielectric distance d21.

Here, the electrode conductive film 10 corresponds to a first electrode conductive film, the electrode main dielectric film 11 corresponds to a first electrode main dielectric film, the electrode additional dielectric film 12 corresponds to a first electrode additional dielectric film, and the upper main/additional inter-dielectric distance d21 corresponds to a first distance.

As a method of disposing the electrode additional dielectric film 12 below the electrode main dielectric film 11, for example, a method is adopted in which a gap being the upper main/additional inter-dielectric distance d21 between the electrode main dielectric film 11 and the electrode additional dielectric film 12 is provided with the use of a spacer or the like not illustrated.

In the ground side electrode component 2, the electrode main dielectric film 21 is provided on the upper surface of the electrode conductive film 20, and the electrode additional dielectric film 22 is disposed above the electrode main dielectric film 21 at an lower main/additional inter-dielectric distance d22.

That is, the electrode main dielectric film 21 is provided, on the side of the discharge space 61 with respect to the electrode conductive film 20, adjacent to the electrode conductive film 20, and the electrode additional dielectric film 22 is provided, on the side of the discharge space 61 with respect to the electrode main dielectric film 21 at the lower main/additional inter-dielectric distance d22.

Here, the electrode conductive film 20 corresponds to a second electrode conductive film, the electrode main dielectric film 21 corresponds to a second electrode main dielectric film, the electrode additional dielectric film 22 corresponds to a second electrode additional dielectric film, and the lower main/additional inter-dielectric distance d22 corresponds to a second distance.

As a method of disposing the electrode additional dielectric film 22 above the electrode main dielectric film 21, for example, a method is adopted in which a gap being the lower main/additional inter-dielectric distance d22 between the electrode main dielectric film 21 and the electrode additional dielectric film 22 is provided with the use of a spacer or the like not illustrated.

The electrode main dielectric film 11 (11A, 11B) includes the whole electrode conductive film 10 (10A, 10B) in a plan view in the XY plane, and has a formation area sufficiently larger than the electrode conductive film 10.

For example, in the first mode illustrated in FIG. 2, the high-voltage side electrode component 1A includes a circular electrode conductive film 10A, an electrode main dielectric film 11A, and an electrode additional dielectric film 12A, each of which is circular in shape in a plan view. When viewed in a plan view in the XY plane, the center positions of the electrode conductive film 10A, the electrode main dielectric film 11A, and the electrode additional dielectric film 12A are aligned.

And, the electrode main dielectric film 11A includes the whole electrode conductive film 10A in a plan view, and has a formation area larger than the electrode conductive film 10A.

Further, in the second mode illustrated in FIG. 3, the high-voltage side electrode component 1B includes an electrode conductive film 10B, an electrode main dielectric film 11B, and an electrode additional dielectric film 12B, each of which is square in shape in a plan view. When viewed in a plan view in the XY plane, the center positions of the electrode conductive film 10B, the electrode main dielectric film 11B, and the electrode additional dielectric film 12B are aligned.

And, the electrode main dielectric film 11B includes the whole electrode conductive film 10B in a plan view, and has a formation area larger than the electrode conductive film 10B.

Returning to FIG. 1, the electrode additional dielectric film 12 includes the electrode conductive film 10 in a plan view and has a formation area slightly larger than the electrode conductive film 10 and smaller than the electrode main dielectric film 11. In addition, it is desirable that the electrode additional dielectric film 12 has an area which is substantially the same as that of the electrode conductive film 10 in a plan view.

For example, in the first mode illustrated in FIG. 2, the electrode additional dielectric film 12A includes the electrode conductive film 10A in a plan view and has a formation area slightly larger than the electrode conductive film 10A and smaller than the electrode main dielectric film 11A.

Further, in the second mode illustrated in FIG. 3, the electrode additional dielectric film 12B includes the electrode conductive film 10B in a plan view and has a formation area slightly larger than the electrode conductive film 10B and smaller than the electrode main dielectric film 11B.

The planar structure of the ground side electrode component 2 also has the following relationship as in the high-voltage side electrode component 1.

The electrode main dielectric film 21 includes the whole electrode conductive film 20 in a plan view in the XY plane, and has a formation area larger than the electrode conductive film 20.

The electrode additional dielectric film 22 includes the electrode conductive film 20 in a plan view and has a formation area slightly larger than the electrode conductive film 20 and smaller than the electrode main dielectric film 21. Note that it is desirable that the electrode additional dielectric film 22 has an area which is substantially the same as the electrode conductive film 20 in a plan view.

Further, the electrode main dielectric film 11 and the electrode main dielectric film 21 have substantially the same planar shape, the electrode additional dielectric film 12 and the electrode additional dielectric film 22 have substantially the same planar shape, and the electrode conductive film 10 and the electrode conductive film 20 have substantially the same planar shape.

In such an active gas generation electrode group 51, the discharge space 61 exists that includes a region where the electrode conductive film 10 and the electrode conductive film 20 overlap in a plan view in the XY plane, in the main dielectric space where the electrode additional dielectric film 12 and the electrode additional dielectric film 22 face each other.

The space defined by the upper main/additional inter-dielectric distance d21 between the electrode main dielectric film 11 and the electrode additional dielectric film 12 is an additional dielectric space 71. The additional dielectric space 71 corresponds to a first additional dielectric space.

The space defined by the lower main/additional inter-dielectric distance d22 between the electrode main dielectric film 21 and the electrode additional dielectric film 22 is an additional dielectric space 72. The additional dielectric space 72 corresponds to a second additional dielectric space.

For the active gas generation electrode group 51 having such a configuration, a dielectric barrier discharge is caused in the discharge space 61 by applying an AC voltage between the electrode conductive film 10 and the electrode conductive film 20 from a high-frequency power source 9.

As a result, the active gas generation apparatus of Embodiment 1 including the active gas generation electrode group 51 can activate the source gas supplied to the discharge space 61 to generate the active gas.

Further, the additional dielectric spaces 71 and 72 are set such that the dielectric barrier discharge is not caused in the respective additional dielectric spaces 71 and 72 when the dielectric barrier discharge is caused in the discharge space 61 in the main dielectric space.

That is, the active gas generation electrode group 51 satisfies the discharge classification requirements in which "no dielectric barrier discharge occurs in the respective additional dielectric spaces 71 and 72 when the dielectric barrier discharge is caused in the discharge space 61 in the main dielectric space".

In the active gas generation electrode group 51 of Embodiment 1, the main dielectric space is provided between the electrode additional dielectric film 12 being the first electrode additional dielectric film and the electrode additional dielectric film 22 of the ground side electrode component 2 being the second electrode additional dielectric film. The discharge space 61 exists in the main dielectric space.

The electrode additional dielectric film 12 includes the electrode conductive film 10 in a plan view and has a formation area larger than the electrode conductive film 10 and smaller than the electrode main dielectric film 11.

Therefore, when the dielectric barrier discharge is caused in the discharge space 61, the thermal stress in the electrode additional dielectric film 12 can be maintained at a low level because the electrode additional dielectric film 12 is heated in a relatively uniform manner due to the smaller formation area than the electrode main dielectric film 11.

For example, if the electrode additional dielectric film 12 has almost the same forming area as the electrode conductive film 10, the electrode additional dielectric film 12 is heated almost uniformly when the dielectric barrier discharge occurs in the discharge space 61. And therefore, almost no thermal stress is occurred in the electrode additional dielectric film 12.

In addition, the electrode main dielectric film 11 is located at a position at the upper main/additional inter-dielectric distance d21 from the electrode additional dielectric film 12; therefore, relatively less heat to be transmitted from the electrode additional dielectric film 12 to the electrode main dielectric film 11.

Furthermore, the thermal conductivity of the gas is significantly lower than the thermal conductivity of the solid, and the upper main/additional inter-dielectric distance d21, which is the gap length of the additional dielectric space 71, is relatively short; therefore, it is presumed that the gas flow is small and the less heat is transmitted due to convection.

Accordingly, the heat transmission form the discharge space 61 to the electrode main dielectric film 11 can be maintained at a low level by the addition of the electrode additional dielectric film 12, and the damage of the electrode main dielectric film 11 due to the thermal stress can be prevented.

Further, by adopting quartz having a relatively low thermal conductivity as a constituent material of the spacer that defines the upper main/additional inter-dielectric distance d21, the heat transmission through the spacer can also reliably be suppressed.

As a result, in the active gas generation apparatus of Embodiment 1, the damaging phenomenon due to thermal stress during the dielectric barrier discharge can be suppressed, with respect to the electrode additional dielectric film 12 and the electrode main dielectric film 11.

Further, the electrode main dielectric film 11 includes the electrode conductive film 10 in a plan view and has a larger forming area than the electrode conductive film 10 and the electrode additional dielectric film 12; therefore, the end portion of the electrode main dielectric film 11 and the end portion of the electrode conductive film 10 do not match. Therefore, occurrence of creeping discharge at the end portion of the high-voltage side electrode component 1 can be suppressed.

Therefore, the active gas generation apparatus of Embodiment 1 ensures to maintain the unobstructed occurrence state of the dielectric barrier discharge.

In addition, in the active gas generation electrode group 51, the electrode conductive film 10, the electrode main dielectric film 11, the electrode additional dielectric film 12, the electrode conductive film 20, the electrode main dielectric film 21, and the electrode additional dielectric film 22 all adopt a flat plate structure. That is, the active gas generation electrode group 51 can be realized at a relatively moderate cost because an intricate structure is not required.

In Embodiment 1, the electrode additional dielectric film 22 includes the electrode conductive film 20 in a plan view and has a formation area slightly larger than the electrode conductive film 20 and smaller than the electrode main dielectric film 21.

Therefore, when the dielectric barrier discharge is caused in the discharge space 61, the thermal stress in the electrode additional dielectric film 22 can be maintained at a low level because the electrode additional dielectric film 22 is heated in a relatively uniform manner due to the smaller formation area than the electrode main dielectric film 21.

For example, if the electrode additional dielectric film 22 has almost the same forming area as the electrode conductive film 20, the electrode additional dielectric film 22 is heated almost uniformly when the dielectric barrier discharge occurs. And therefore, almost no thermal stress is occurred in the electrode additional dielectric film 22.

In addition, the electrode main dielectric film 21 is located at a position at the lower main/additional inter-dielectric distance d22 from the electrode additional dielectric film 22; therefore, relatively less heat to be transmitted from the electrode additional dielectric film 22 to the electrode main dielectric film 21.

As a result, in the active gas generation apparatus of Embodiment 1, the damaging phenomenon due to thermal stress during the dielectric barrier discharge can be suppressed, with respect to the electrode additional dielectric film 22 and the electrode main dielectric film 21.

Further, the electrode main dielectric film 21 includes the electrode conductive film 20 in a plan view and has a larger forming area than the electrode conductive film 20; therefore, the end portion of the electrode conductive film 20 and the end portion of the electrode main dielectric film 21 do not match. Accordingly, the occurrence of creeping discharge at the end portion of the ground side electrode component 2 can further be suppressed.

Therefore, the active gas generation apparatus of Embodiment 1 ensures to maintain the unobstructed occurrence state of the dielectric barrier discharge.

(Setting for Dielectric Barrier Discharge)

The active gas generation electrode group 51 of Embodiment 1 satisfies the discharge classification requirements in which "no dielectric barrier discharge occurs in the respective additional dielectric spaces 71 and 72 when the dielectric barrier discharge is caused in the discharge space 61 in the main dielectric space".

That is, in Embodiment 1, parameters, such as the upper main/additional inter-dielectric distance d21 and the lower main/additional inter-dielectric distance d22 are appropriately set so that the above discharge classification requirements can be satisfied.

The above upper main/additional inter-dielectric distance d21 and the lower main/additional inter-dielectric distance d22 are setting target parameters to be set appropriately based on the discharge conditions. The discharge conditions include conditions such as the gas type, the atmospheric pressure of the discharge field (discharge space), and the material and thickness of the dielectric film.

Here, taking the case where the setting target parameters are the upper main/additional inter-dielectric distance d21 and the lower main/additional inter-dielectric distance d22 as an example, the setting processing for discharge restriction parameter will be described in detail which sets the value of the setting target parameter such that the above discharge classification requirements are satisfied.

In the above case, the relative permittivity and the film thickness of each of the electrode main dielectric films 11 and 21, the relative permittivity and the film thickness of each of the electrode additional dielectric films 12 and 22, and the gap length d61 of the discharge space 61, and the like are set in advance.

Here, in the active gas generation electrode group 51 illustrated in FIG. 1, ε11 being the main dielectric relative permittivity of the dielectric being a constituent material of the electrode main dielectric film 11 is set to "10", and the main dielectric film thickness is set to 1 mm. Likewise, ε12 being the main dielectric relative permittivity of the dielectric being a constituent material of the electrode main dielectric film 21 is set to "10", and the main dielectric film thickness t21 is set to 1 mm.

Further, ε1 being the additional dielectric relative permittivity of the dielectric being a constituent material of the electrode additional dielectric film 12 is set to "10", and the additional dielectric film thickness t12 of the electrode additional dielectric film 12 is set to 0.5 mm. Further, ε22 being the additional dielectric relative permittivity of the dielectric being a constituent material of the electrode additional dielectric film 22 is set to "10", and the additional dielectric film thickness t22 of the electrode additional dielectric film 22 is set to 0.5 mm.

The film thicknesses of the electrode main dielectric films 11 and 21 and the electrode additional dielectric films 12 and 22 are uniform.

In addition, the gap length d61 of the discharge space 61 is set to 1 mm, the relative permittivity of the gas occupying the discharge space 61 and the additional dielectric spaces 71 and 72 is set to "1", and the atmospheric pressure of the discharge space 61 is set to 760 torr. And, the voltage applied, by the high-frequency power source 9, between the electrode conductive film 10 and the electrode conductive film 20 is set to 10000 V.

When the discharge conditions are set in advance as described above, for example, the upper main/additional inter-dielectric distances d21 and d22 are both set to 0.25 mm as the setting processing for discharge restriction parameters. As a result, the active gas generation electrode group 51 of Embodiment 1 satisfies the above discharge classification requirements. This point will be described in detail below.

When taking no consideration of the effect of electric charge (wall charge) occurred on the surface of each of the electrode additional dielectric films 12 and 22, the voltage ratio applied to each of the electrode main dielectric film 11, the additional dielectric space 71, the electrode additional dielectric film 12, the discharge space 61, the electrode additional dielectric film 22, the additional dielectric space 72, and the electrode main dielectric film 21 can be calculated from the ratio of the respective capacitances.

Capacitance is proportional to the (relative) permittivity divided by its thickness. Here, the combined capacitance of the electrode main dielectric films 11 and 21 is C11, the combined capacitance of the additional dielectric spaces 71 and 72 is C71, and the combined capacitance of the electrode additional dielectric films 12 and 22 is C12, and the capacitance of the discharge space 61 is C61. In this case, the values of the capacitances C11, C71, C12, and C61 are obtained from the following Equations (1) to (4).

$$C11 = 10/(1 \cdot 2) = 5 \quad (1)$$

$$C71 = 1/(0.25 \cdot 2) = 2 \quad (2)$$

$$C12 = 10/(0.5 \cdot 2) = 10 \quad (3)$$

$$C61 = 1/1 = 1 \quad (4)$$

In Equations (1) to (4), the capacitance C61 is set as the reference value "1".

The voltage ratio {V11:V71:V12:V61} over the four regions corresponding to the above-mentioned capacitances C11, C71, C12 and C61 is obtained as the reciprocal of the capacitance.

The voltage value V11 indicates the voltage value applied to the combined region of the electrode main dielectric films 11 and 21, and the voltage value V71 indicates the voltage value applied to the combined region of the additional dielectric spaces 71 and 72. Further, the voltage value V12 indicates the voltage value applied to the combined region of the electrode additional dielectric films 12 and 22, and the voltage value V61 indicates the voltage value applied to the discharge space 61.

Under the voltage value setting described above, the voltage ratio {V11:V71:V12:V61} is calculated from the following Equation (5).

$$\{V11:V71:V12:V61\} = \{2:5:1:10\} \quad (5)$$

In Equation (5), the voltage value V12 is set as the reference value "1".

Therefore, when an AC voltage of 10000 V is applied, from the high-frequency power supply 9, between the electrode conductive films 10 and 20, the discharge voltage V61 applied to the discharge space 61 is about 5556 V (=(10000·10/18) V). On the other hand, the total voltage applied to the additional dielectric spaces 71 and 72 is about 2778 V (=(10000·5/18) V). The total voltage is dispersed in the additional dielectric spaces 71 and 72; therefore, the voltage {V71/2} applied to each of the additional dielectric spaces 71 and 72 is about 1389 V.

When calculating the presence or absence of occurrence of dielectric breakdown at the atmospheric pressure of 760 torr based on Paschen's law, it is necessary to apply a voltage of 5000 V for the discharge space 61 and 1800 V for each of the additional dielectric spaces 71 and 72.

Therefore, Embodiment 1 ensures the dielectric barrier discharge not to occur in the additional dielectric spaces 71 and 72, when 10000 V is applied between the electrode conductive films 10 and 20 to occur a dielectric barrier discharge in the discharge space 61.

Accordingly, the above discharge classification requirements can be surely satisfied by performing the setting processing for discharge restriction parameter to set the upper main/additional inter-dielectric distance d21 and the lower main/additional inter-dielectric distance d22.

(Complement)

It should be noted that, in Embodiment 1, the electrode conductive film 10, the electrode main dielectric film 11, the electrode additional dielectric film 12, and the upper main/additional inter-dielectric distance d21 are classed as a first electrode conductive film or the like, or "first group" and the electrode conductive film 20, the electrode main dielectric film 21, the electrode additional dielectric film 22, and the lower main/additional inter-dielectric distance d22 are classed as a second electrode conductive film or the like, or "second group".

However, the relationship between "first group" and "second group" may be reversed. That is, the above-mentioned effect can be exhibited as it is if the electrode conductive film 10, the electrode main dielectric film 11, the electrode additional dielectric film 12, and the upper main/additional inter-dielectric distance d21 are classed as the "second group" and the electrode conductive film 20, the electrode main dielectric film 21, the electrode additional dielectric film 22, and the lower main/additional inter-dielectric distance d22 are classed as the "first group".

Embodiment 2

FIG. 4 is an explanatory diagram illustrating a structure of an active gas generation electrode group 52 in an active gas generation apparatus according to Embodiment 2 of the present disclosure and the peripheral portion thereof. The XYZ rectangular coordinate system is illustrated in FIG. 4.

Hereinafter, in the active gas generation electrode group 52, the parts common to the active gas generation electrode group 51 described in Embodiment 1 are denoted by the same reference numerals and the description thereof will be omitted as appropriate, and the characteristics of the active gas generation electrode group 52 will be mainly described.

As illustrated in FIG. 4, the active gas generation electrode group 52 differs from the active gas generation electrode group 51 of Embodiment 1 in that the ground side electrode component 2 is replaced with the ground side electrode component 2X.

The ground side electrode component 2X being the second electrode component includes only an electrode conductive film 20X being the second electrode conductive film.

The electrode conductive film 20X has a planar shape similar to that of the electrode main dielectric film 11. That is, the electrode conductive film 20X includes the whole electrode additional dielectric film 12 in a plan view in the XY plane, and has a formation area larger than the electrode additional dielectric film 12. The electrode conductive film 20X may also have a planar shape similar to that of the electrode conductive film 10.

Therefore, in the active gas generation electrode group 52, the space between the electrode additional dielectric film 12 of the high-voltage side electrode component 1 and the electrode conductive film 20X of the ground side electrode component 2X is the main dielectric space, and a discharge space 62 exists in the main dielectric space.

That is, in the active gas generation electrode group 52, the discharge space 62 exists that includes a region where the electrode conductive film 10 and the electrode conductive film 20X overlap in a plan view in the XY plane in the main dielectric space where the electrode additional dielectric film 12 of the high-voltage side electrode constituent unit 1 and the electrode conductive film 20X of the ground side electrode constituent unit 2 face each other.

As is the same with the active gas generation electrode group 51, the space defined by the upper main/additional inter-dielectric distance d21 between the electrode main dielectric film 11 and the electrode additional dielectric film 12 is an additional dielectric space 71 (the first additional dielectric space) in the active gas generation electrode group 52.

On the other hand, the ground side electrode component 2X does not include a dielectric film corresponding to the electrode additional dielectric film 22; therefore, no second additional dielectric space exists.

For the active gas generation electrode group 52 having such a configuration, a dielectric barrier discharge is caused in the discharge space 62 by applying an AC voltage between the electrode conductive film 20X and the electrode conductive film 10 from a high-frequency power source 9.

As a result, the active gas generation apparatus of Embodiment 2 including the active gas generation electrode group 52 can activate the source gas supplied to the discharge space 62 to generate the active gas.

Further, the active gas generation electrode group 52 is set to satisfy the discharge classification requirements in that "the dielectric barrier discharge is not caused in the additional dielectric space 71 when the dielectric barrier discharge is caused in the discharge space 62 in the main dielectric space".

That is, also in Embodiment 2, the discharge classification requirements can be surely satisfied as is the same with Embodiment 1 by performing the setting processing for discharge restriction parameter. It should be noted that, the principle of the setting processing for discharge restriction parameter is the same as that described in Embodiment 1: therefore, the specific description of the setting processing for discharge restriction parameter in Embodiment 2 will be omitted.

The active gas generation electrode group 52 includes a high-voltage side electrode component 1 having the same structure as the active gas generation electrode group 51 of Embodiment 1; therefore, the same effect as Embodiment 1 is exhibited with the high-voltage side electrode component 1.

In addition, in the active gas generation electrode group 52, the electrode conductive film 10, the electrode main dielectric film 11, the electrode additional dielectric film 12, and the electrode conductive film 20X all adopt a flat plate structure. That is, the active gas generation electrode group 52 can be realized at a relatively moderate cost because an intricate structure is not required.

As described above, in the active gas generation electrode group 52 included in the active gas generation apparatus of Embodiment 2, the space between the electrode additional dielectric film 12 and the electrode conductive film 20X is the main dielectric space, and the discharge space 62 exists in the main dielectric space.

Accordingly, in the active gas generation apparatus of Embodiment 2, the damaging phenomenon due to thermal stress during the dielectric barrier discharge can be suppressed, with respect to the electrode main dielectric film 11 and the electrode additional dielectric film 12 as is the same with Embodiment 1.

In addition, the ground side electrode component 2X is composed of only the electrode conductive film 20X. By using a material that does not easily cause a damaging phenomenon due to thermal stress as a constituent material of the electrode conductive film 20X, the damaging phenomenon due to thermal stress is suppressed, with respect to the electrode conductive film 20X that is the discharge surface of the discharge space 62.

Embodiment 3

FIG. 5 is an explanatory diagram illustrating a structure of an active gas generation electrode group 53 in an active gas generation apparatus according to Embodiment 3 of the present disclosure and the peripheral portion thereof. The XYZ rectangular coordinate system is illustrated in FIG. 5.

Hereinafter, in the active gas generation electrode group 53, the parts common to the active gas generation electrode group 51 described in Embodiment 1 are denoted by the same reference numerals and the description thereof will be omitted as appropriate, and the characteristics of the active gas generation electrode group 53 will be mainly described.

As illustrated in FIG. 5, the active gas generation electrode group 53 differs from the active gas generation electrode group 51 of Embodiment 1 in that the ground side electrode component 2 is replaced with the ground side electrode component 2Y.

In the ground side electrode component 2 being the second electrode component, the electrode additional dielectric film 22 being the second electrode additional dielectric film is provided, above the electrode conductive film 20Y being the second electrode conductive film, at a lower conductor/additional inter-dielectric distance d32 (the second distance) with respect to the electrode conductive film 20Y being the second electrode conductive film.

The electrode conductive film 20Y has a planar shape similar to that of the electrode main dielectric film 11. That is, the electrode conductive film 20Y includes the whole electrode additional dielectric film 22 in a plan view in the XY plane, and has a formation area larger than the electrode additional dielectric film 22.

Further, the electrode additional dielectric film 12 and the electrode additional dielectric film 22 have substantially the same planar shape. The electrode conductive film 20Y may also have a planar shape similar to that of the electrode conductive film 10.

As a method of disposing the electrode additional dielectric film 22 above the electrode conductive film 20Y, for example, it is conceivable to adopt a method in which a gap being the lower conductor/additional inter-dielectric distance d32 between the electrode conductive film 20Y and the electrode additional dielectric film 22 is provided with the use of a spacer or the like not illustrated.

Therefore, in the active gas generation electrode group 53, the space between the electrode additional dielectric film 12 of the high-voltage side electrode component 1 and the electrode additional dielectric film 22 of the ground side electrode component 2Y is the main dielectric space, and a discharge space 63 exists in the main dielectric space.

That is, in the active gas generation electrode group 53, the discharge space 63 exists that includes a region where the electrode conductive film 10 and the electrode conductive film 20Y overlap in a plan view in the XY plane in the main dielectric space where the electrode additional dielectric film 12 of the high-voltage side electrode constituent unit 1 and the electrode additional dielectric film 22 of the ground side electrode constituent unit 2 face each other.

As is the same with the active gas generation electrode group 51, the space defined by the upper main/additional inter-dielectric distance d21 (the first distance) between the electrode main dielectric film 11 and the electrode additional dielectric film 12 is an additional dielectric space 71 (the first additional dielectric space) in the active gas generation electrode group 53.

And the space defined by the lower conductor/additional inter-dielectric distance d32 (the second distance) between the electrode conductive film 20Y and the electrode additional dielectric film 22 is an additional dielectric space 72C (the second additional dielectric space).

For the active gas generation electrode group 53 having such a configuration, a dielectric barrier discharge is caused in the discharge space 63 by applying an AC voltage between the electrode conductive film 10 and the electrode conductive film 20Y from a high-frequency power source 9.

As a result, the active gas generation apparatus of Embodiment 3 including the active gas generation electrode group 53 can activate the source gas supplied to the discharge space 63 to generate the active gas.

Further, the active gas generation electrode group 53 is configured to satisfy the discharge classification requirements in that "the dielectric barrier discharge is not caused in each of the additional dielectric spaces 71 and 72C when the dielectric barrier discharge is caused in the discharge space 63 in the main dielectric space".

That is, also in Embodiment 3, the discharge classification requirements can be surely satisfied as is the same with Embodiment 1 by performing the setting processing for discharge restriction parameter. It should be noted that, the principle of the setting processing for discharge restriction parameter is the same as that described in Embodiment 1: therefore, the specific description of the setting processing for discharge restriction parameter in Embodiment 3 will be omitted.

The active gas generation electrode group 53 includes a high-voltage side electrode component 1 having the same structure as the active gas generation electrode group 51 of Embodiment 1; therefore, the same effect as Embodiment 1 is exhibited with the high-voltage side electrode component 1 and the electrode additional dielectric film 22 of the ground side electrode component 2Y.

In addition, in the active gas generation electrode group 53, the electrode conductive film 10, the electrode main dielectric film 11, the electrode additional dielectric film 12, the electrode conductive film 20Y, and the electrode additional dielectric film 22 all adopt a flat plate structure. That is, the active gas generation electrode group 53 can be realized at a relatively moderate cost because an intricate structure is not required.

Further, in the active gas generation electrode group 53, the electrode additional dielectric film 22 being the second electrode additional dielectric film is located at a position at the lower conductor/additional inter-dielectric distance d32 (the second distance) from the electrode conductive film 20Y being the second electrode conductive film.

Accordingly, the electrode additional dielectric film 22 is disposed at the lower conductor/additional inter-dielectric distance d32 from the electrode conductive film 20Y without contacting the electrode conductive film 20Y; therefore, relatively less heat to be transmitted from the electrode conductive film 20Y to the electrode additional dielectric film 22.

As a result, in the active gas generation apparatus of Embodiment 3, the damaging phenomenon due to thermal stress during the dielectric barrier discharge can be suppressed, with respect to the electrode additional dielectric film 22.

OTHERS

In all the active gas generation electrode groups 51 and 53, discharge spaces 61 and 63 are formed between the electrode additional dielectric film 12 and the electrode additional dielectric film 22.

Therefore, the electrode main dielectric film 11 (and the electrode main dielectric film 21) that is not directly related with the discharge spaces 61 and 63 can have an arbitrary intricate shape by using a constituent material having good workability.

On the other hand, as the constituent materials of the electrode additional dielectric films 12 and 22, a material having great sputtering resistance (typically a material that is hard and difficult to process into a complicated shape) is to be adoptable, or application of a substance having catalytic properties to the surfaces of the electrode additional dielectric films 12 and 22, or other treatments, is to be adoptable.

An electrode structure may also be adopted in which a third electrode additional dielectric film which is subjected to the application of catalyst or other treatments, is further disposed in the discharge space 61 (63) between the electrode additional dielectric films 12 and 22 to raise the contact probability between the catalyst and the gas (source gas).

Further, in each of the active gas generation electrode groups 51 to 53, even if the electrode additional dielectric film 12 (and 22) is damaged by the dielectric barrier discharge, the damage is restricted only to the electrode additional dielectric film 12. Therefore, by adopting a structure in which the replacement of the electrode additional dielectric film 12 is facilitated, an increase in the longevity of the active gas generation apparatus is achievable.

Further, another advantageous feature is that, in the active gas generation electrode groups 51 to 53, the electrode main dielectric film 11 (and 21) requires a certain thickness (strength) because it is a structure, whereas the electrode additional dielectric film 12 (and 22) may be extremely thin.

Meanwhile, when the electrode additional dielectric film 12 is produced using bulk ceramics as a constituent material, the difficulty lies in making it thinner; therefore, the constituent material of the electrode additional dielectric film 12 is limited. In addition, in some cases, a problem arises that impurities are contained in order to improve the workability of the electrode additional dielectric film 12.

Taking the above points into consideration, for example, the electrode additional dielectric film 12 may be formed such that an insulating material (dielectric) is formed on a sheet-shaped metal film by a CVD method or a sputtering method so that the entire metal film is covered with the insulating material. As described above, there is an advantageous feature that products having various compositions and high purity can be produced as the electrode additional dielectric film 12 (and 22).

It should be noted that Embodiments of the present invention can be arbitrarily combined and can be appropriately modified or omitted without departing from the scope of the invention.

The invention claimed is:

1. An active gas generation apparatus comprising:
   a first electrode component that includes a first electrode conductive film; and
   a second electrode component that includes a second electrode conductive film, the second electrode component being provided to face the first electrode component, wherein an active gas is obtained by activating a source gas supplied to a discharge space between the first electrode component and the second electrode component,
   wherein the discharge space is defined as a region where the first and the second electrode conductive films overlap in a plan view, in which an AC voltage is applied between the first and the second electrode conductive films,
   wherein the first electrode component further includes
      a first main dielectric film, the first main dielectric film being provided on a side of the discharge space with respect to the first electrode conductive film, and being adjacent to the first electrode conductive film, and
      a first additional dielectric film, the first additional dielectric film being provided on a side of the discharge space with respect to the first main dielectric film, at a first distance with respect to the first main dielectric film, in which a first additional dielectric space is provided between the first main dielectric film and the first additional dielectric film,
   wherein the first additional dielectric space is set such that a dielectric barrier discharge is not caused in the first additional dielectric space when the dielectric barrier discharge is caused in the discharge space,
   wherein the first main dielectric film overlaps the first electrode conductive film in a plan view, and has a formation area larger than the first electrode conductive film, and
   wherein the first additional dielectric film overlaps the first electrode conductive film in a plan view, and has a formation area larger than the first electrode conductive film and smaller than the first main dielectric film.

2. The active gas generation apparatus according to claim 1,
   wherein the second electrode component includes only the second electrode conductive film, and
   wherein a space between the first additional dielectric film and the second electrode conductive film is the discharge space.

3. The active gas generation apparatus according to claim 1,
   wherein, in the first electrode component, the first main dielectric film is provided on a lower surface of the first electrode conductive film, and
   wherein, in the first electrode component, the first additional dielectric film is provided, below the first main dielectric film, at the first distance with respect to the first main dielectric film,
   wherein, the second electrode component further includes
      a second main dielectric film provided on an upper surface of the second electrode conductive film, and
      a second additional dielectric film, the second additional dielectric film being provided above the second main dielectric film, at a second distance with respect to the second main dielectric film,
   wherein a second additional dielectric space is provided between the second main dielectric film and the second additional dielectric film,
   wherein the second additional dielectric space is set such that a dielectric barrier discharge is not caused in the second additional dielectric space when the dielectric barrier discharge is caused in the discharge space,
   wherein the second main dielectric film overlaps the second electrode conductive film in a plan view, and has a formation area larger than the second electrode conductive film, and
   wherein the second additional dielectric film overlaps the second electrode conductive film in a plan view, and has a formation area larger than the second electrode conductive film and smaller than the second main dielectric film.

4. The active gas generation apparatus according to claim 3,
   wherein the second electrode component includes only the second electrode conductive film and the second additional dielectric film,
   wherein the second additional dielectric film is provided on a side of the discharge space with respect to the second electrode conductive film, without contacting the second electrode conductive film, and
   wherein a space between the first additional dielectric film and the second additional dielectric film is the discharge space.

5. The active gas generation apparatus according to claim 4,
   wherein, in the second electrode component, the second additional dielectric film is provided, above the second electrode conductive film, at a third distance with respect to the second electrode conductive film, and wherein, in the second electrode component, the second additional dielectric space is provided between the second electrode conductive film and the second additional dielectric film.

6. The active gas generation apparatus according to claim 1, wherein each of the first electrode conductive film, the first main dielectric film, and the first additional dielectric film is circular in shape in a plan view, and wherein center positions of the first electrode conductive film, the first main dielectric film, and the first additional dielectric film are aligned in a plan view.

7. The active gas generation apparatus according to claim 1, wherein each of the first electrode conductive film, the first main dielectric film, and the first additional dielectric film is square in shape in a plan view, and wherein center positions of the first electrode conductive film, the first main dielectric film, and the first additional dielectric film are aligned in a plan view.

8. The active gas generation apparatus according to claim 1, wherein the first distance between the first main dielectric film and the first additional dielectric film is adjusted by a spacer.

9. The active gas generation apparatus according to claim 8, wherein a value of a first voltage applied to the first additional dielectric space is set in association with the first distance, so that the value of the first voltage is less than a first threshold value while the dielectric barrier discharge is caused in the discharge space, the first threshold value being a criteria to cause the dielectric barrier discharge in the first additional dielectric space.

10. The active gas generation apparatus according to claim 1, wherein a material of the first additional dielectric film is a material having sputtering resistance.

11. The active gas generation apparatus according to claim 1, wherein a substance having catalytic properties is applied to a surface of the first additional dielectric film on the side of discharge space.

12. The active gas generation apparatus according to claim 1, further comprising:

a third additional dielectric film which is subjected to application of catalyst, that is disposed in the discharge space between the first additional dielectric film and the second electrode component.

13. The active gas generation apparatus according to claim 3, wherein each of the second electrode conductive film, the second main dielectric film, and the second additional dielectric film is circular in shape in a plan view, and wherein center positions of the second electrode conductive film, the second main dielectric film, and the second additional dielectric film are aligned in a plan view.

14. The active gas generation apparatus according to claim 3, wherein each of the second electrode conductive film, the second main dielectric film, and the second additional dielectric film is square in shape in a plan view, and center positions of the second electrode conductive film, the second main dielectric film, and the second additional dielectric film are aligned in a plan view.

15. The active gas generation apparatus according to claim 3, wherein the second distance between the second main dielectric film and the second additional dielectric film is adjusted by a spacer.

16. The active gas generation apparatus according to claim 15, wherein wherein a value of a second voltage applied to the second additional dielectric space is set in association with the second distance, so that the value of the second voltage value is less than a second threshold value while the dielectric barrier discharge is caused in the discharge space, the second threshold value being a criteria to cause the dielectric barrier discharge in the second additional dielectric space.

17. The active gas generation apparatus according to claim 3, wherein a material of the second additional dielectric film is a material having sputtering resistance.

18. The active gas generation apparatus according to claim 3, wherein a substance having catalytic properties is applied to a surface of the second additional dielectric film on the side of discharge space.

* * * * *